(12) United States Patent
Eddleman et al.

(10) Patent No.: US 9,374,105 B2
(45) Date of Patent: Jun. 21, 2016

(54) CONVERTING TIME-ENCODED SIGNAL INTO ANALOG OUTPUT

(71) Applicant: LINEAR TECHNOLOGY CORPORATION, Milpitas, CA (US)

(72) Inventors: Daniel James Eddleman, San Jose, CA (US); Chad Thomas Steward, Sunnyvale, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/669,508

(22) Filed: Mar. 26, 2015

(65) Prior Publication Data

US 2015/0295589 A1    Oct. 15, 2015

Related U.S. Application Data

(60) Provisional application No. 61/977,351, filed on Apr. 9, 2014.

(51) Int. Cl.
*H03M 1/82*    (2006.01)
*H03K 9/08*    (2006.01)

(52) U.S. Cl.
CPC ........ *H03M 1/822* (2013.01); *H03K 9/08* (2013.01)

(58) Field of Classification Search
CPC ...... H03M 1/822; H03M 1/82; H03M 1/1215
USPC .................................. 341/152, 110; 375/340
See application file for complete search history.

(56) References Cited

U.S. PATENT DOCUMENTS

| 3,506,848 | A | 4/1970 | Beurrier |
| 6,208,280 | B1 | 3/2001 | Baker et al. |
| 7,408,392 | B2 | 8/2008 | Ivanov |
| 7,479,907 | B2 * | 1/2009 | Lazar .................... H03M 1/121 341/110 |
| 2004/0223545 | A1 | 11/2004 | Lee |
| 2005/0190865 | A1 * | 9/2005 | Lazar .................... H03M 1/125 375/340 |

FOREIGN PATENT DOCUMENTS

GB    2247120 A    2/1992

OTHER PUBLICATIONS

European Patent Office (EPO). 2015. Partial European Search Report, dated Nov. 5, 2015, for European Patent Application 15001040.3, entitled "Converting Time-Encoded Signal Into Analog Output," European counterpart to instant application.
European Patent Office. 2016. Extended European Search Report, dated Feb. 23, 2016, for EP Application No. 15001040.3, counterpart to the instant application.

* cited by examiner

*Primary Examiner* — Jean B Jeanglaude
(74) *Attorney, Agent, or Firm* — McDermott Will & Emery LLP

(57) ABSTRACT

A converter may generate an analog output that is representative of a time-encoded signal. The circuit may include an input port receiving the time-encoded signal; a time-encoded to digital converter coupled to the input port; and a digital-to-analog converter coupled to the time-encoded to digital converter.

25 Claims, 4 Drawing Sheets

CONVERTING TIME-ENCODED SIGNAL INTO ANALOG OUTPUT

CROSS-REFERENCE TO RELATED APPLICATION

This application is based upon and claims priority to U.S. provisional patent application 61/977,351, entitled "Circuit For Converting Value Encoded In A Time-Based Signal Into An Analog Quantity," filed Apr. 9, 2014. The entire content of this application is incorporated herein by reference.

BACKGROUND

1. Technical Field

This disclosure relates to converters that generate an analog output indicative of a time-encoded signal.

2. Description of Related Art

Time-encoded signals may be used in many applications to efficiently encode and transmit information. For the purpose of this disclosure, a time-encoded signal is defined to be a signal that, at any given time, represents one state of two or more states, with the relationship between an encoding parameter and a timebase used to encode a value of interest. Encoding parameters may characterize time intervals separating transitions between the states. Examples of encoding parameters and timebases include pulse-width, period, duty cycle, frequency, and phase.

Pulse width characterizes the time interval during which the signal continually represents a first state. Period characterizes the time interval separating successive recurrences of a transition by which the signal enters a first state. Duty cycle is a unit-less parameter that characterizes the ratio of the pulse-width divided by the period. Frequency, commonly expressed in units of cycles per second or Hertz (Hz), characterizes the rate of recurrence of successive transitions by which the signal enters a first state, and may be calculated by dividing one by the period. Phase, commonly expressed in units of degrees or radians, characterizes the relationship in time between the time-encoded signal and a timebase.

A time-encoded signal may be a digital voltage signal with precisely two predefined states characterized by a logic high voltage level and a logic low voltage level.

FIGS. 1A, 1B, 1C, 1D, and 1E show examples of digital voltage signals using these encoding parameters to time-encode a range of values. FIG. 1A shows an example of a time-encoded signal using variable duty cycle and constant period. FIG. 1B shows an example of a time-encoded signal using variable pulse-width high and constant pulse-width low. FIG. 1C shows an example of a time-encoded signal using variable period and constant duty cycle. FIG. 1D shows an example of a time-encoded signal using variable frequency and constant duty cycle. FIG. 1E shows an example of a time-encoded signal comprising an encoding signal having variable phase and a timebase having constant phase.

Pulse-width modulated (PWM) signals are an example of time-encoded signals wherein values are encoded using the pulse-width (FIG. 1B) or duty cycle (FIG. 1A) of the signal. For the example of a PWM signal implemented as a digital voltage signal, pulse-width high is the time-related parameter characterizing the interval when PWM signal is in the logic high voltage state, and pulse-width low is the time-related parameter characterizing the interval when the PWM signal is in the logic low voltage state. In this example, the period is defined to be the interval between successive low-to-high (or high-to-low) transitions, that is also equal to the sum of the pulse-width high plus the pulse-width low.

The duty cycle of a PWM signal may be defined as the ratio of the pulse-width high divided by the period. Examples of PWM signals include signals that maintain a constant period while varying the pulse-width high, pulse-width low, and duty cycle (FIG. 1A). Other examples include PWM signals that maintain a constant pulse-width low (FIG. 1B) while varying the pulse-width high and period, and PWM signals that maintain a constant pulse-width high while varying the pulse-width low and period.

In many applications, it is desirable to convert a time-encoded signal into an analog quantity, such as a voltage, current, power, impedance, temperature, speed, mechanical position, etc. For example, a wide variety of microcontrollers and other logic devices commonly include pulse-width modulated (PWM) outputs with programmable duty cycle for use in controlling analog voltages. Further examples include controlling the brightness of an LED based upon the duty cycle of a signal, controlling the position of a mechanical servo based upon the pulse-width of a signal, and controlling the speed of a motor based upon the frequency of a signal.

In many such applications, it is further desirable to provide a useful value at an analog output, even when the input signal is not present, as when other components in a system are disabled to save power, or during some time interval after power is initially applied to a system. For example, in some applications the analog output needs to be centered within the analog output range when power is first applied to the system, so that the output may be subsequently adjusted in either direction. In other applications, a zero volt output is required during power-up, and still others require a high-impedance output when an input signal is not present.

FIG. 2 shows an example of a prior art circuit using a low-pass filter 203 and a buffer amplifier 207 to generate an analog voltage output 208 in response to the duty cycle of a pulse-width modulated (PWM) digital voltage input signal at signal input 202. Assuming a continuous PWM input signal, such as a waveform 201 with a fixed duty cycle, the average voltage at the signal input 202 may be determined by the input duty cycle, input logic high voltage, and input logic low voltage. The voltage at a filter output 206 and the analog voltage output 208 may be the average voltage of the input signal with an undesired saw tooth-shaped ripple voltage superimposed upon it at the frequency of the PWM input, such as in a waveform 209. The magnitude of undesired voltage ripple present at the filter output 206 and the analog voltage output 208 may be determined by the ratio of the bandwidth of the low-pass filter 203 to the frequency of the PWM signal at the signal input 202, with the bandwidth of the low pass filter 203 determined by the values of a resistor 204 and a capacitor 205.

For applications requiring high accuracy, a very low bandwidth filter and very high frequency input may be required to sufficiently reduce this undesired ripple. Assuming the bandwidth of the low pass filter 203 is low enough that the undesired ripple at the filter output 206 and the analog voltage output 208 is sufficiently small to achieve the desired accuracy, the analog voltage output 208 may be determined by the average value of the input voltage at the signal input 202, and thus may effectively be determined by the input duty cycle, input logic high voltage, and input logic low voltage.

The approach shown in FIG. 2 may suffer from a number of limitations in terms of speed, accuracy, and flexibility. The bandwidth of the low-pass filter 203 may limit the speed of the circuit, and may be much slower than the PWM input frequency. This problem may be made worse by the large ratios between filter bandwidth and PWM frequency that may be required in high-accuracy applications. In many applications, the need to overcome this speed limitation may require the use of undesirably large component values for the resistor 204 and the capacitor 205 and an undesirably high-frequency for the PWM input signal waveform 201, increasing system cost and complexity.

The accuracy and stability of the output of the circuit in FIG. 2 may further be limited by the accuracy and stability of the logic high and logic low voltage levels of the input signal at the signal input 202. Such logic levels may be derived from logic power supply voltages that may suffer from poor initial accuracy and large temperature drift.

Another problem with this circuit may be that it offers no convenient way to provide a useful analog output at the analog voltage output 208 when power is initially applied to the system, or in the presence of prolonged intervals between transitions of the input signal at the signal input 202, for example, when the source of the PWM input signal is powered-down.

Other circuits (e.g. those shown in U.S. Pat. No. 6,208,280 and U.S. Pat. No. 7,408,392) may employ current sources and capacitors to convert a PWM signal to an analog voltage. These approaches may represent an improvement over the low-pass filter of FIG. 2 in terms of speed and accuracy, but may suffer from other limitations in terms of flexibility. They may require the continuous presence of a PWM input signal of constant frequency. The values of current sources and capacitors may also need to be chosen to accommodate a narrow range of PWM input frequencies.

Circuits for converting a time-encoded signal into an analog quantity may suffer from undesirable limitations in terms of speed and accuracy. Such circuits may not be flexible enough to work with a wide variety of input signals or to provide a useful analog output when an input signal is not present or when a parameter of an input signal is outside of a normal operating range. What is needed is a circuit for converting a time-encoded signal into an analog quantity that is advantageous in terms of speed, accuracy, and flexibility.

SUMMARY

A converter may generate an analog output that is representative of a time-encoded signal. The converter may include an input port receiving the time-encoded signal; a time-encoded to digital converter coupled to the input port; and a digital-to-analog converter coupled to the time-encoded to digital converter.

A converter may generate an analog output that is representative of a plurality of time-encoded signals. The converter may include a plurality of inputs ports that receives the plurality of input signals; a time-encoded to digital converter coupled to the input ports; and a digital-to-analog converter coupled to the time-encoded to digital converter.

A converter may generate a plurality of analog outputs representative of a plurality of time-encoded signals. The converter may include: a plurality of input ports receiving the plurality of time-encoded signals; a time-encoded to digital converter coupled to the input ports; and a plurality of digital-to-analog converters coupled to the time-encoded to digital converter.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Examples of converters for generating analog outputs representative of time-encoded signals will now be provided.

Figure 3:
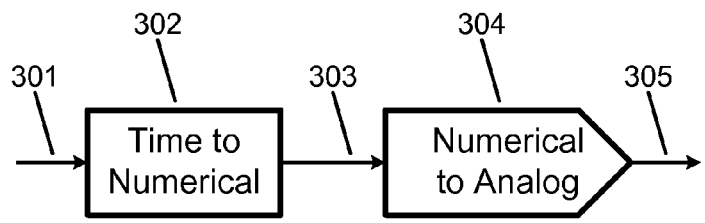
FIG. 3 shows a block diagram of an example of a converter for generating an analog output that is representative of a time-encoded signal.

FIG. 3 shows a block diagram of a converter for generating an analog output representative of a time-encoded signal. The converter may include an input port 301 receiving a time-encoded signal, a time-encoded to digital converter 302 generating a digital output 303 representative of the time-encoded signal, and a digital-to-analog converter (DAC) 304 receiving the digital output 303 and generating an analog output 305 representative of the time-encoded signal.

The time-encoded signal received at input port 301 may encode a value of interest using a relationship between an encoding parameter and a timebase. Examples of such an encoding parameter or timebase may include a time interval, pulse-width, period, frequency, phase, or delay.

The time-encoded signal may comprise both the encoding parameter and the timebase. For example, the time-encoded signal may be a binary signal having a pulse-width high representing an encoding interval and a period representing a timebase interval, and the ratio of the pulse-width high to the period may encode a value of interest as in FIG. 1A. Alternatively, the time-encoded signal may comprise a first binary signal representing an encoding phase and a second binary signal representing a timebase phase as in FIG. 1E. A three-state time-encoded signal may represent the summation of a first binary encoding signal having an encoding frequency and a second binary signal having a timebase frequency.

The time-encoded signal may comprise the encoding parameter without comprising the timebase. For example, the time-encoded signal may encode the value of interest as the ratio of an encoding pulse-width to a predetermined time interval as in FIG. 1B, or as the ratio of an encoding frequency to a predetermined frequency as in FIG. 1D.

The time-encoded signal may comprise multiple encoding parameters or multiple timebases.

The input port 301 may receive the time-encoded signal at a single node or at multiple nodes. The input port 301 may receive a binary voltage having a logic high state and a logic low state. The input port 301 may receive a multi-level voltage having three or more states. The input port 301 may receive a single-ended voltage or a differential voltage. The input port 301 may receive something other than a voltage, such as a current.

The time-encoded to digital converter 302 may be configured to evaluate a relationship between an encoding parameter and a timebase. The time-encoded to digital converter 302 may be configured to evaluate a relationship between multiple encoding parameters and a timebase. The time-encoded to digital converter 302 may be configured to evaluate a relationship between multiple encoding parameters and multiple timebases.

The time-encoded to digital converter 302 may receive the timebase as part of the time-encoded signal received at input port 301, or the time-encoded to digital converter 302 may comprise the timebase. The time-encoded to digital converter 302 may comprise a clock. The clock may be used to evaluate the encoding parameter or the timebase.

The time-encoded to digital converter 302 may comprise a circuit for generating the clock or the timebase. Examples of such circuits include oscillators, one-shots, phase-locked loops (PLLs), or delay-locked loops (DLLs).

The time-encoded to digital converter 302 may comprise a counter. The counter may be configured to provide a measured value representative of the encoding parameter or the timebase. The time-encoded to digital converter 302 may comprise a memory circuit configured to store a value. The time-encoded to digital converter 302 may comprise arithmetic logic circuits configured to calculate relationships between measured values.

The time-encoded to digital converter 302 may be configured to evaluate a time interval $T_{INTERVAL}$. The time-encoded to digital converter 302 may comprise a clock having a period $T_{CLK}$ and a counter configured to reset a value $N_{COUNT}$ to zero at the start of $T_{INTERVAL}$, to increment $N_{COUNT}$ at each rising edge of the clock during $T_{INTERVAL}$, and to hold $N_{COUNT}$ constant after $T_{INTERVAL}$. The time-encoded to digital converter 302 may further comprise a memory configured to store the value $N_{COUNT}$ after $T_{INTERVAL}$. The stored value of $N_{COUNT}$ may represent the time interval $T_{INTERVAL}$, where $N_{COUNT}=T_{INTERVAL}/T_{CLK}$. The resolution of the value $N_{COUNT}$ may be determined in part by $T_{CLK}$. The accuracy of the value $N_{COUNT}$ may be determined in part by the accuracy of the period $T_{CLK}$.

The time-encoded to digital converter 302 may be configured to evaluate the ratio of a first time interval $T_{FIRST}$ to a second time interval $T_{SECOND}$. The time-encoded to digital converter 302 may comprise a clock having a period $T_{CLK}$, a counter, and a memory. The counter and memory may be configured to generate a first value $N_{FIRST}$ and a second value $N_{SECOND}$. The first value $N_{FIRST}$ may represent the time interval $T_{FIRST}$, where $N_{FIRST}=T_{FIRST}/T_{CLK}$. The second value $N_{SECOND}$ may represent the time interval $T_{SECOND}$, where $N_{SECOND}=T_{SECOND}/T_{CLK}$. The time-encoded to digital converter 302 may further comprise an arithmetic logic circuit configured to calculate the value $D_{OUT}=N_{FIRST}/N_{SECOND}$. The value $D_{OUT}$ may represent the ratio of $T_{FIRST}$ to $T_{SECOND}$. The resolution and accuracy of the value $D_{OUT}$ may be determined in part by the degree to which $T_{SECOND} \gg T_{CLK}$. The accuracy of the value $N_{COUNT}$ may not depend on the accuracy of the period $T_{CLK}$.

The digital output 303 may be a multi-bit parallel binary number. Alternative implementations may be chosen. Examples include, but are not limited to, single-bit serial and multi-bit parallel implementations of binary, offset binary, two's complement, Gray code, thermometer code, one-hot code, 8b/10b code, binary coded decimal, hexadecimal, and various combinations of these and other encoding schemes.

The digital-to-analog converter (DAC) 304 may be configured to receive the digital output 303 and generate an analog output 305 representative of the digital output 303. Numerous circuits and architectures for digital-to-analog converters may target requirements of various applications in terms of speed, resolution, accuracy, power consumption, and other parameters. The performance of the DAC 304 may in part determine the speed, resolution, and accuracy of the analog output 305.

The DAC 304 may be configured to generate a voltage output, a current output, or an impedance output. The DAC 304 may comprise a resistor string DAC, resistive ladder DAC, R-2R DAC, capacitive DAC, oversampling DAC, multiplying DAC, or a current steering DAC. The DAC 304 may comprise a digital potentiometer generating a resistance output. The DAC 304 may comprise a digitally tunable capacitor generating a capacitance output.

The DAC 304 may further comprise analog output circuits that may generate a modified representation of an analog value as the analog output 305. Such analog output circuits may include, but are not limited to, amplifiers, buffers, inverting and non-inverting gain stages, analog level-shifters, voltage-to-current converters, current-to-voltage converters, current mirrors, integrators, differentiators, filters, etc.

Figure 1A:
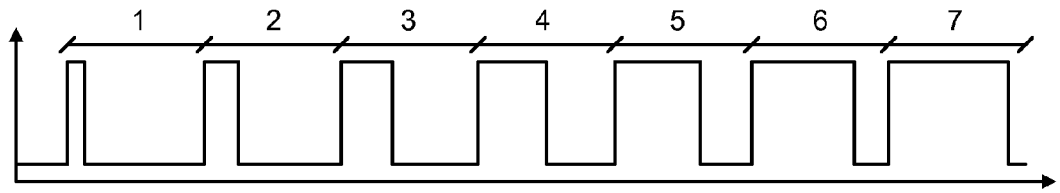
FIGS. 1A-1E shows examples of time-encoded signals.

The converter of FIG. 3 may be configured to generate an analog output representative of a duty-cycle-encoded signal similar to the signal shown in FIG. 1A. The input port 301 may be configured to receive the duty-cycle-encoded signal. During each cycle of the duty-cycle-encoded signal, the time-encoded to digital converter 302 may be configured to measure an encoding pulse-width high ($T_{PWH}$) and a timebase period ($T_{PER}$), calculate a value $D_{OUT}=T_{PWH}/T_{PER}$, and to provide the value $D_{OUT}$ at the digital output 303. The value $D_{OUT}$ may be representative of the duty cycle of the duty-cycle-encoded signal.

Figure 1B:
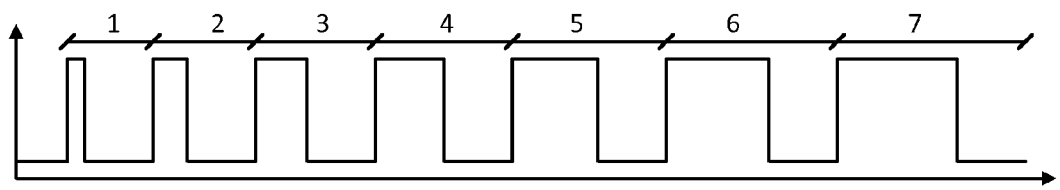

The converter of FIG. 3 may be configured to generate an analog output representative of a pulse-width-encoded signal similar to the signal shown in FIG. 1B. The input port 301 may be configured to receive the pulse-width-encoded signal. The time-encoded to digital converter 302 may comprise a timebase having a period $T_{TBPER}$. During each cycle of the pulse-width-encoded signal, the time-encoded to digital converter 302 may be configured to measure an encoding pulse-width high $T_{PWH}$ and the timebase period $T_{TBPER}$, to calculate a value $D_{OUT}=T_{PWH}/T_{TBPER}$, and to provide the value $D_{OUT}$ at the digital output 303. The value $D_{OUT}$ may be representative of the pulse-width high of the pulse-width-encoded signal relative to the timebase period.

Figure 1C:
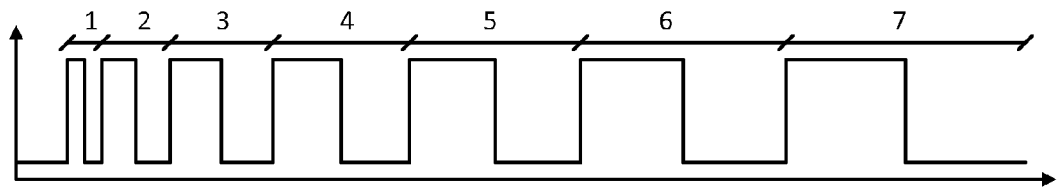

The converter of FIG. 3 may be configured to generate an analog output representative of a period-encoded signal similar to the signal shown in FIG. 1C. The input port 301 may be configured to receive the period-encoded signal. The time-encoded to digital converter 302 may comprise a timebase having a period $T_{TBPER}$. During each cycle of the period-encoded signal, the time-encoded to digital converter 302 may be configured to measure an encoding period $T_{ENPER}$ and the timebase period $T_{TBPER}$, to calculate a value $D_{OUT}=T_{ENPER}/T_{TBPER}$, and to provide the value $D_{OUT}$ at the digital output 303. The value $D_{OUT}$ may be representative of the period of the period-encoded signal relative to the timebase period.

Figure 1D:
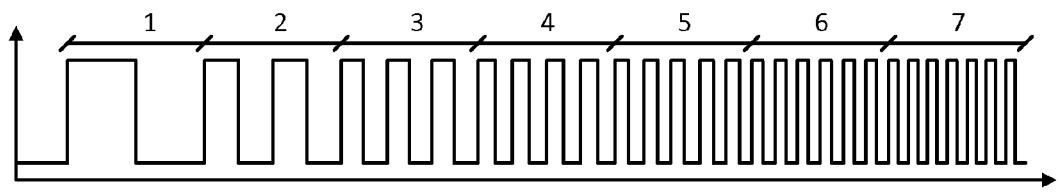

The converter of FIG. 3 may be configured to generate an analog output representative of a frequency-encoded signal similar to the signal shown in FIG. 1D, having an encoding frequency $F_{ENCODE}$. The input port 301 may be configured to receive the frequency-encoded signal. The time-encoded to digital converter 302 may comprise a timebase having a period $T_{TBPER}$. The time-encoded to digital converter 302 may be configured to count a number of cycles $N_{CYCLES}$ of the encoding frequency occurring during each timebase period $T_{TBPER}$, where $N_{CYCLES}=F_{ENCODE}\times T_{TBPER}$, and to provide the value $N_{CYCLES}$ at the digital output 303. The value $N_{CYCLES}$ may be representative of the frequency of the frequency-encoded signal.

Figure 1E:
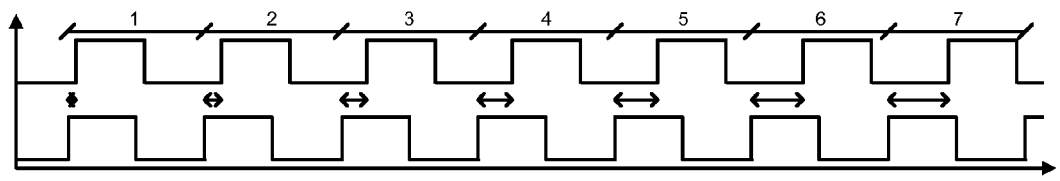
Figure 2:
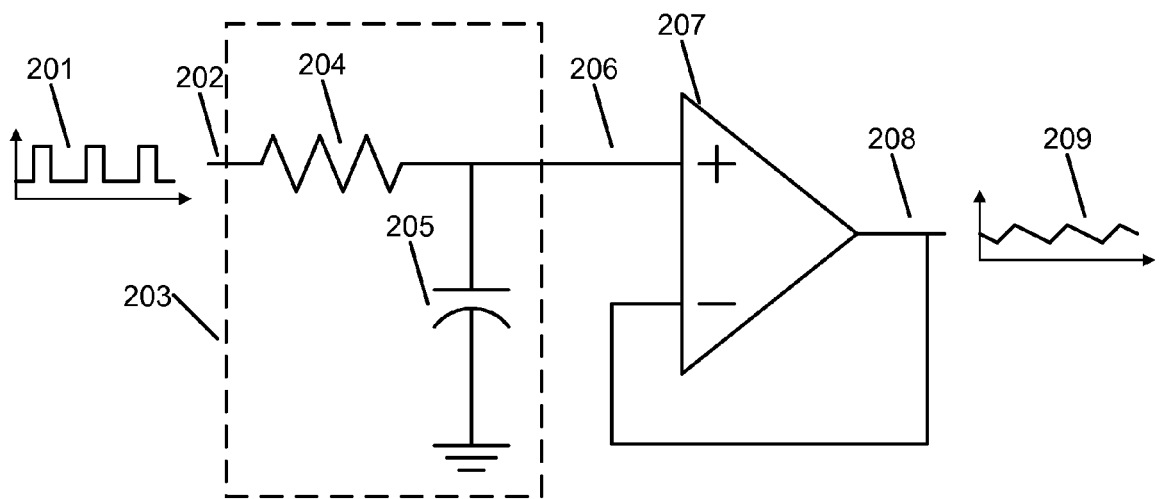
FIG. 2 illustrates an example of a prior art low-pass filter and buffer amplifier that convert the duty cycle of a pulse-width modulated (PWM) signal to an analog voltage.

The converter of FIG. 3 may be configured to generate an analog output representative of a phase-encoded signal, similar to the signal shown in FIG. 1E. The input port 301 may be configured to receive a phase-encoded signal. The phase-encoded signal may comprise a timebase having a period $T_{TBPER}$ and an encoding signal having a phase shift $T_{PHASE}$ relative to the timebase. During each cycle of the timebase, the time-encoded to digital converter 302 may be configured to measure the phase shift $T_{PHASE}$ and the timebase period $T_{TBPER}$, to calculate a value $D_{OUT}=T_{PHASE}/T_{TBPER}$, and to provide the value $D_{OUT}$ at the digital output 303. The value $D_{OUT}$ may be representative of the phase of the encoding signal relative to the phase of the timebase.

The converter of FIG. 3 may further comprise a non-volatile memory configured to retain a stored value even when power has been removed.

The converter of FIG. 3 may further comprise a power-on circuit configured to provide a power-on reset signal. The power-on reset signal may be asserted whenever a power supply voltage is below a predefined threshold voltage sufficient for reliable operation. The converter of FIG. 3 may be configured to force the analog output 305 to be in one or more power-on states when the power-on reset signal is asserted. The power-on states may include a zero-scale state, a mid-scale state, a full-scale state, a high-impedance state, a low-impedance state, or a controlled-impedance state. The power-on states may also include analog output states representative of values stored in a non-volatile memory.

The converter of FIG. 3 may further comprise an out-of-range circuit configured to provide one or more out-of-range indicators. The out-of-range indicators may be asserted whenever a parameter of the time-encoded signal is outside one or more normal operating ranges. The normal operating ranges may include ranges bounded by a minimum or maximum period, pulse-width, frequency, or voltage. The converter of FIG. 3 may be configured to force the analog output 305 to be in one or more out-of-range states when one or more of the out-of-range indicators are asserted. The out-of-range states may include a zero-scale state, a mid-scale state, a full-scale state, a high-impedance state, a low-impedance state, or a controlled-impedance state. The out-of-range states may also include analog output states representative of values stored in a memory.

Figure 4:
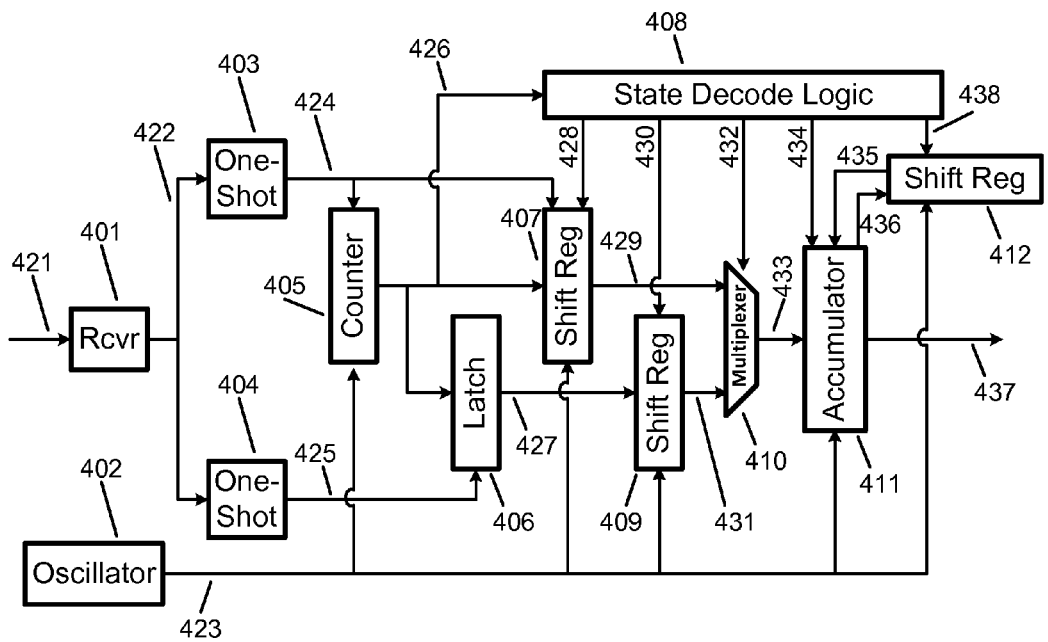
FIG. 4 shows a block diagram of an example of a time-encoded to digital converter configured to provide a digital output representing the duty cycle of a PWM input signal.

FIG. 4 shows a block diagram of an example of a time-encoded to digital converter configured to provide a digital output representing the duty cycle of a pulse-width modulated (PWM) input signal. The example shown in FIG. 4 may be used as the time-encoded to digital converter 302 shown in FIG. 3. The time-encoded to digital converter may be configured to receive a pulse-width modulated (PWM) digital voltage input signal at a signal input 421 similar to the signal shown in FIG. 1A and to provide a multi-bit binary digital output at an accumulator output 437 that is representative of the duty cycle of the PWM signal at the signal input 421.

After each rising edge of the signal at the signal input 421, the circuit may measure the pulse-width high and the period of the signal at the signal input 421 using an oscillator 402 and a counter 405, normalize the measurement results, calculate a first quantity representative of the duty cycle of the signal at the signal input 421 by dividing the measured pulse-width by the measured period, and provide a digital output at the accumulator output 437 that is representative of the duty cycle.

A receiver circuit 401 may be configured to provide a receiver output 422 that is logic high when the voltage at the signal input 421 exceeds a first threshold voltage, and to provide a logic low when the voltage at the signal input 421 is less than the first threshold voltage. A one-shot circuit 403 may be configured to provide a pulse at a one-shot output 424 in response to a rising edge at the receiver output 422. A one-shot circuit 404 may be configured to provide a pulse at a one-shot output 425 in response to a falling edge on the receiver output 422.

The oscillator 402 may be configured to provide a clock at an oscillator output 423. The counter 405 may be configured to provide a digital output at a counter output 426. The numerical value of the digital output at the counter output 426 may be increased by one in response to each rising edge of the clock at the oscillator output 423. The counter 405 may further be configured to reset the numerical value at the counter output 426 to zero in response to a pulse at the one-shot output 424 that results from a rising edge on the PWM signal at the signal input 421. The numerical value at the counter output 426 may represent the number of cycles of the clock at the oscillator output 423 that have elapsed since the most recent rising edge of the PWM signal at the signal input 421.

A latch 406 may be configured to provide a stored digital output at a latch output 427. The numerical value at the latch output 427 may be updated to equal the value at the counter output 426 in response to a pulse at the one-shot output 425 resulting from a falling edge on the PWM signal at the signal input 421.

A shift register 409 may be configured to provide a stored digital output at a shift register output 431. The numerical value at the shift register output 431 may be updated to equal the value at the latch output 427 in response to a pulse at the one-shot output 424 resulting from a rising edge on the PWM signal at the signal input 421. Thus, immediately after each rising edge of the PWM signal at the signal input 421, the numerical value at the shift register output 431 may represent the pulse-width high time of the preceding cycle of the PWM signal at the signal input 421, expressed in units of cycles of clock at the oscillator output 423.

A shift register 407 may be configured to provide a stored digital output at a shift register output 429. The numerical value at the shift register output 429 may be updated to equal the value at the counter output 426 in response to a pulse at the one-shot output 424 resulting from a rising edge on the PWM signal at the signal input 421. Thus, immediately after each rising edge of the PWM signal at the signal input 421, the numerical value at the shift register output 429 may represent the period of the preceding cycle of the PWM signal at the signal input 421, expressed in units of cycles of the clock at the oscillator output 423.

A state decode logic circuit 408 may be configured to receive the digital signal at the counter output 426 and provide control signals at state decode logic outputs 428, 430, 432, 434, and 438. The shift registers 407 and 409, in combination with a multiplexer 410, an accumulator 411, and a shift register 412, may further be configured to perform a sequence of arithmetic operations in response to the clock at the oscillator output 423 and the control signals at the state decode logic outputs 428, 430, 432, 434, and 438. The state decode logic circuit 408 may be configured to control the sequence of arithmetic operations to occur during the cycles of the clock at the oscillator output 423 that follow each rising edge of the PWM signal at the signal input 421. The arithmetic operations may calculate the ratio of the value represented at the shift register output 431 divided by the value represented at the shift register output 429 to substantially represent the ratio of the pulse-width high to the period, and thus the duty cycle of the PWM signal at the signal input 421.

During a first operation of this sequence, the contents of the shift registers 407 and 409 may be shifted left repeatedly in response to the clock at the oscillator output 423 until the most significant bit of the digital output at the shift register output 429 is a logic one. This operation may be equivalent to repeatedly multiplying the value of both the signal at the shift register output 429 and the signal at the shift register output 431 by two, and may effectively normalize the signal at the shift register output 429 to represent a value between one-half and one.

During a second operation of this sequence, the shift register 407, the multiplexer 410, the accumulator 411, and the shift register 412 may be used to calculate the quantity 1 divided by the value of the signal at the shift register output 429. During this operation, the multiplexer 410 may connect the signal at the shift register output 429 of the shift register 407 to an accumulator input 433 of the accumulator 411. The shift register 407 may be configured to shift right repeatedly in response to the clock at the oscillator output 423. The accumulator 411 may contain an adder and an accumulation register. The adder may be configured to add the contents of the shift register 407 to the value represented at accumulator output 437, and to provide a summation result to the accumulation register. The accumulation register may be configured to store the summation result and provide the accumulator output 437.

During each clock cycle at the oscillator output 423, if the summation result provided by the adder contained within accumulator 411 is less than or equal to one, a logic one may be shifted into the shift register 412 at signal 436 and the accumulator output 437 may be updated. If the summation result provided by the adder contained within accumulator 411 is greater than one, a logic zero may be shifted into the shift register 412 at signal 436 and the accumulator output 437 may not be updated. At the end of this second operation, the contents of the shift register 412 may represent the desired result.

During a third operation of this sequence, the multiplexer 410 and the accumulator 411 may be used to multiply the contents of the shift register 409 by the contents of the shift register 412. During this operation, the multiplexer 410 may connect the shift register output 431 of the shift register 409 to the accumulator input 433 of the accumulator 411. The shift register 412 may be configured to shift left repeatedly in response to the clock at the oscillator output 423, the shift register 409 may be configured to shift right repeatedly in response to the clock at the oscillator output 423, and the accumulator 411 may be configured to add the contents of the shift register 409 to the accumulator output 437.

During each clock cycle at the oscillator output 423, if the value shifted out of the shift register 412 at signal 435 is a logic one, the accumulator output 437 may be updated. If the value shifted out of the shift register 412 at signal 435 is a logic zero, the accumulator output 437 may not be updated. At the end of this third operation, the accumulator output 437 may represent the ratio of the pulse-width high to the period, and thus the duty cycle of the PWM signal at the signal input 421.

The period of the clock at the oscillator output 423 that is generated by the oscillator 402 may determine the resolution in time of the duty cycle measurement. The period of the clock at the oscillator output 423 may be short enough to achieve the desired accuracy for the shortest expected period of the PWM signal at the signal input 421. The maximum possible value of the counter output 426 provided by the counter 405 may determine the ratio between the shortest and longest PWM periods for which an accurate duty cycle may be calculated. The logarithm (base 2) of this ratio may thus determine the number of bits required in the counter 405, the latch 406, and the shift registers 407 and 409.

The resolution and accuracy desired for the duty cycle to voltage conversion may determine the number of bits in multiplexer 410, the accumulator 411, and the shift register 412. Normalizing the pulse width high (at the shift register output 429) and the period (at the shift register output 431) prior to the arithmetic operations may prevent the ratio between the shortest and longest possible PWM periods from further increasing the required number of bits in the multiplexer 410, the accumulator 411, and the shift register 412.

The converter circuit of FIG. 3 may include an out-of-range circuit that forces the analog output 305 to either a zero-scale value or a full-scale value when the period of the time-encoded signal at the input port 301 exceeds a predetermined maximum period. The time-encoded to digital converter 302 may be implemented according to the block diagram of FIG. 4 and may include the out-of-range circuit. The out-of-range circuit may be configured to force the accumulator output 437 to be equal to a zero-scale value or a full-scale value when the period of the input signal at the signal input 421 exceeds a predetermined maximum period. The predetermined maximum period may be equal to the period of the clock at the oscillator output 423 multiplied by the maximum value of the counter output 426 provided by the counter 405.

The out-of-range circuit may be configured to receive the signal at the counter output 426 from the counter 405 and to provide an overrange indicator signal that is asserted when the signal at the counter output 426 equals its maximum possible value. The accumulator 411 may be further configured to receive the overrange indicator signal and force the signal at the accumulator output 437 to be equal to a zero-scale value when the overrange indicator signal is asserted and the signal at the signal input 421 is a logic low. The accumulator 411 may be further configured to force the signal at the accumulator output 437 to be equal to a full-scale value when the overrange indicator signal is asserted and the signal at the signal input 421 is a logic high.

Figure 5:
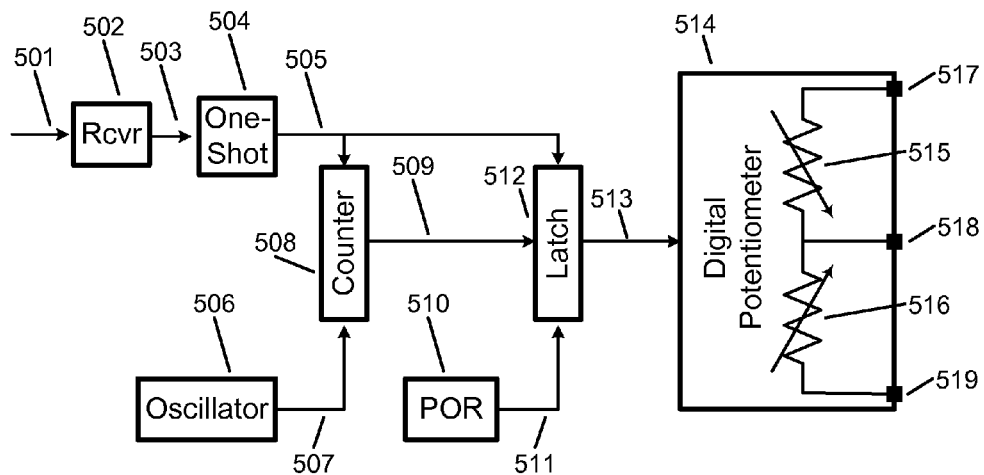
FIG. 5 shows a block diagram of an example of a converter that generates an impedance representing the period of a time-encoded signal.

FIG. 5 shows a block diagram of an example of a converter circuit configured to receive a period-encoded signal at an input port 501 similar to the signal in FIG. 1C and to provide an impedance 516 representative of the period of the period-encoded signal. A receiver circuit 502, a one-shot 504, an oscillator 506, a counter 508, a power on reset (POR) circuit 510, and a latch 512 may be configured to operate as a time-encoded to digital converter and to provide a multi-bit binary digital number at a latch output 513 that is representative of the period of the period-encoded signal. A DAC circuit may be configured as a digital potentiometer 514 that receives the multi-bit binary digital number at the latch output 513 of the latch 512 and controls the impedance 516 to be substantially proportional to the period of the period-encoded signal.

The digital potentiometer 514 may further be configured to control an impedance 515 such that the total impedance from a node 517 to a node 519 equals the sum of the impedance 515 plus the impedance 516 and is substantially constant, and so that the ratio of the impedance 516 to the total impedance between the nodes 517 and 519 is substantially proportional to the period of the signal at the signal input 501. The power on reset (POR) circuit 510, the latch 512, and the digital potentiometer 514 may further be configured such that the impedance 516 is centered within the range of possible values when power is initially applied to the system.

The receiver circuit 502 may be configured to provide a receiver output 503 that is logic high when the voltage at the input port 501 exceeds a first threshold voltage, and to provide a logic low when the voltage at the input port 501 is less than the first threshold voltage. The one-shot 504 may be configured to provide a pulse at a one-shot output 505 in response to a rising edge on the receiver output 503.

The oscillator 506 may be configured to provide a clock at a clock output 507. The counter 508 may be configured to provide a digital output at a counter output 509. The numerical value of the digital output at the counter output 509 may be increased by one in response to each rising edge of the clock at the clock output 507. The counter 508 may further be configured to reset the numerical value of the counter output 509 to zero in response to a pulse at the one-shot output 505 resulting from a rising edge on the signal at the signal input 501. The numerical value of the counter output 509 may represent the number of cycles of the clock at the clock output 507 that have elapsed since the most recent rising edge of the signal at the signal input 501.

The power-on reset (POR) circuit 510 may be configured to provide a signal at a POR output 511 that is logic low when a power supply voltage is below a supply voltage threshold necessary for proper operation, and to provide a logic high some time after the power supply voltage crosses above the supply voltage threshold necessary for proper operation.

The latch 512 may be configured to provide a stored digital signal at the latch output 513. The numerical value of the signal at the latch output 513 may be updated to equal the value of the signal at the counter output 509 in response to a pulse at the one-shot output 505 resulting from a rising edge on the input signal at the signal input 501. Thus, immediately after each rising edge of the input signal at the signal input 501, the numerical value of the signal at the latch output 513 may represent the period of the preceding cycle of the signal at the signal input 501, expressed in units of cycles of the clock at the clock output 507. The latch 512 may further be configured to reset the numerical value at the latch output 513 to mid-scale in response to a logic low at the POR output 511. Thus, when power is initially applied to the system, the numerical value at the latch output 513 may be centered within the range of possible values, and the initial value of the impedance 516 may be similarly centered.

Figure 6:
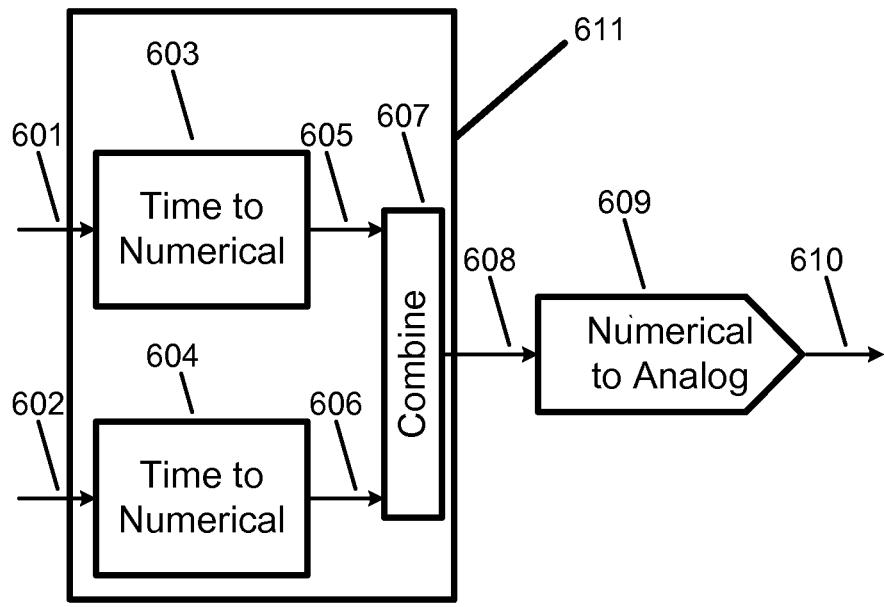
FIG. 6 shows a block diagram of an example of a converter that generates an analog output representing two time-encoded signals.

FIG. 6 shows a block diagram of a converter for generating an analog output representative of two time-encoded signals. The converter may include a pair of input ports 601 and 602 each receiving a time-encoded signal, a time-encoded to digital converter 611 generating a digital output 608 representative of the pair of time-encoded signals, and a digital-to-analog converter (DAC) 609 receiving the digital output 608 and generating an analog output 610 representative of the time-encoded signal.

The time-encoded to digital converter 611 may comprise time-encoded to digital converter 603 configured to provide digital output 605 representative the time-encoded signal received by input port 601, time-encoded to digital converter 604 configured to provide digital output 606 representative the time-encoded signal received by input port 602, and combining circuit 607 configured to receive digital outputs 605 and 606 and provide digital output 608.

The input ports 601 and 602 may be configured to receive a pair of duty-cycle-encoded signals, each similar to the signal shown in FIG. 1A. The time-encoded to digital converter 603 may be configured to provide a value $D_{MSB}$ at the digital output 605 representative of the duty-cycle of the signal received by input port 601. The time-encoded to digital converter 604 may be configured to provide a value $D_{LSB}$ at the digital output 606 representative of the duty-cycle of the signal received by input port 602. The combining circuit 607 may be configured to provide a value $D_{OUT}$ at digital output 608. The combining circuit 607 may be configured such that $D_{OUT}=(K \times D_{MSB})+D_{LSB}$, where K is a constant. The values of $D_{MSB}$ and $D_{LSB}$ may range from 0 to 255, the value of K may be 256, and the value $D_{OUT}$ may range from 0 to 65535. The digital-to-analog converter (DAC) 609 may be configured as a 16-bit DAC and may generate a current at the analog output 610 representative of the digital output 608. The DAC 609 may comprise a resistor string DAC generating an analog voltage. The DAC 609 may further comprise a voltage-to-current converter. The voltage-to-current converter may receive the analog voltage from the resistor string DAC and generate a current at the analog output 610.

Figure 7:
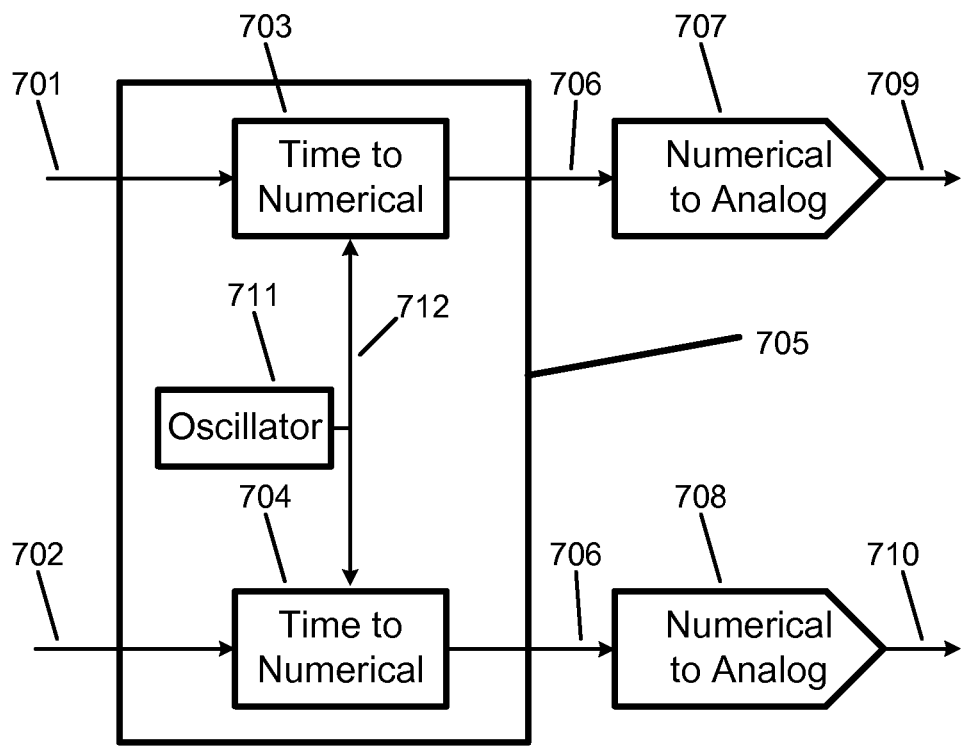
FIG. 7 shows a block diagram of an example of a converter that generates two analog outputs, each representing a different time-encoded signal.

FIG. 7 shows a block diagram of a converter for generating two analog outputs representative of two time-encoded signals. The converter may include a pair of input ports 701 and 702 each receiving a time-encoded signal and a time-encoded to digital converter 705 generating a digital output 706 representative of the time-encoded signals. The converter of FIG. 7 may further include a digital-to-analog converter (DAC) 707 receiving all or part of digital output 706 and generating an analog output 709 representative of the time-encoded signal received by input port 701, and another digital-to-analog converter (DAC) 708 receiving all or part of digital output 706 and generating an analog output 710 representative of the time-encoded signal received by input port 702.

The time-encoded to digital converter 705 may comprise a time-encoded to digital converter 703 configured to provide a first value $D_{FIRST}$ representative of the time-encoded signal received by input port 701, a time-encoded to digital converter 704 configured to provide a second value $D_{SECOND}$ representative of the time-encoded signal received by input port 702, and an oscillator 711 configured to provide a clock 712. The time-encoded to digital converter 705 may be configured to provide the values $D_{FIRST}$ and $D_{SECOND}$ at the digital output 706.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, the appropriate choice of the time-encoded signal, time-encoding scheme, time-encoded to digital converter architecture, digital arithmetic circuits, algorithms, encoding schemes for digital representations of numerical values, architecture of digital-to-analog-converter (DAC), analog output circuits, and analog output parameters may depend on the specific application and other factors such as the available types of semiconductors, capacitors, resistors, reliability voltage limits, silicon area, cost, and additional factors and considerations typically involved in the design of an integrated circuit.

The formats of the time-encoded signals may include, but are not limited to, those with values encoded using pulse-width high, pulse-width low, duty cycle, period, frequency, phase, or any combination of these or other encoding parameters.

The exemplary embodiments of time-encoding that have been described may use digital voltage signals with precisely two predefined states characterized by a logic high voltage level and a logic low voltage level. They may instead use time-encoding that has more than two states. The predefined states may also be characterized by something other than a voltage, such as a current, power, impedance, wavelength, phase, frequency, etc.

Exemplary embodiments of time-encoded to digital converters that have been described may include one-shot circuits, oscillators, counters, shift registers, latches, adders, and other circuit components. They may instead have additional components, different components, and/or not all of the components that have been described. These and the alternatives may include current sources, capacitors, resistors, comparators, analog-to-digital converters (ADCs), phase-locked-loops (PLLs), delay-locked loops (DLLs), filters, and/or other types of components and circuits.

A digital output provided by a time-encoded to digital converter and received by a digital-to-analog converter (DAC) may be a single-bit serial, multi-bit serial, or multi-bit parallel representation. Such a digital representation may be compact or redundant, and may be implemented as a binary number, two's complement number, Gray code, thermometer code, one-hot code, 8b/10b code, binary-coded decimal (BCD), hexadecimal, or any combination of these or other encoding schemes.

A digital-to-analog-converter (DAC) may comprise any circuit for controlling an analog quantity based upon a digital representation of a numerical value, including a resistor string DAC, resistive ladder DAC, capacitive DAC, current steering DAC, voltage-output DAC, current output DAC, oversampling DAC, digital potentiometer, or digitally programmable capacitor. Such a DAC circuit may further comprise one or more additional analog output circuits such as amplifiers, buffers, inverting and non-inverting gain stages, analog level-shifters, voltage-to-current converters, current-to-voltage converters, current mirrors, integrators, differentiators, filters, etc.

An analog output could be any analog quantity such as a single-ended voltage, differential voltage, current, impedance, impedance ratio, resistance, capacitance, inductance, power, temperature, etc.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A converter comprising:
   an input port for receiving a time-encoded signal having an encoding parameter that characterizes time intervals separating transitions between states;
   a time-encoded to digital converter coupled to the input port that determines a numerical value by evaluating a relationship between the encoding parameter and a timebase; and
   a digital to analog converter coupled to the time-encoded to digital converter that receives a digital representation of the numerical value and generates an analog output representative of the time-encoded signal.

2. The converter of claim 1 wherein the time-encoded signal is a pulse-width modulated signal.

3. The converter of claim 1 wherein the time-encoded signal is a frequency-encoded signal.

4. The converter of claim 1 wherein the time-encoded signal is a binary signal.

5. The converter of claim 1 wherein the time-encoded signal comprises a timebase.

6. The converter of claim 1 wherein the time-encoded to digital converter determines a time interval.

7. The converter of claim 1 wherein the time-encoded to digital converter determines a ratio of two time intervals.

8. The converter of claim 1 wherein the time-encoded to digital converter determines a frequency.

9. The converter of claim 1 wherein the time-encoded to digital converter determines a phase.

10. The converter of claim 1 wherein the time-encoded to digital converter comprises a non-volatile memory.

11. The converter of claim 1 wherein the digital to analog converter generates a voltage output.

12. The converter of claim 1 wherein the digital to analog converter generates a current output.

13. The converter of claim 1 wherein the digital to analog converter generates an impedance output.

14. The converter of claim 1 further comprising a timebase.

15. The converter of claim 1 further comprising a power-on circuit.

16. The converter of claim 15 wherein the power-on circuit forces the analog output into one or more power-on states.

17. The converter of claim 16 wherein the power-on states are independent of the time-encoded signal.

18. The converter of claim 1 further comprising an out-of-range circuit.

19. The converter of claim 18 wherein the out-of-range circuit forces the analog output to one or more out-of-range states.

20. A converter comprising:
a plurality of input ports for receiving a plurality of time-encoded signals, each having an encoding parameter that characterizes time intervals separating transitions between states;
one or more time-encoded to digital converters coupled to the input ports that determine a numerical value by evaluating relationships between the encoding parameters and one or more timebases; and
a digital to analog converter coupled to the time-encoded to digital converters that receives a digital representation of the numerical value and generates an analog output representative of the time-encoded signals.

21. The converter of claim 20 wherein the analog output is representative of a weighted sum of the time-encoded signals.

22. A converter comprising:
a plurality of input ports for receiving a plurality of time-encoded signals, each having an encoding parameter that characterizes time intervals separating transitions between states;
one or more time-encoded to digital converters coupled to the input ports that determine one or more numerical values by evaluating relationships between the encoding parameters and one or more timebases; and
a plurality of digital to analog converters coupled to the time-encoded to digital converters that receive a plurality of digital representations of the numerical values and generate a plurality of analog outputs representative of the time-encoded signals.

23. The converter of claim 22 further comprising at least one component that is common to all of the time-encoded to digital converters or all of the digital to analog converters.

24. A method for providing an analog output representative of a time encoded signal having an encoding parameter that characterizes time intervals separating transitions between states comprising:
converting a time-encoded signal into a digital representation of a numerical value by evaluating a relationship between the encoding parameter and a timebase; and
subsequently converting said digital representation into an analog output.

25. A method for providing an analog output representative of a plurality of time encoded signals, each having an encoding parameter that characterizes time intervals separating transitions between states comprising:
converting a plurality of time-encoded signals into a digital representation of a numerical value by evaluating relationships between the encoding parameters and one or more timebases; and
subsequently converting said digital representation into an analog output.

* * * * *